United States Patent
Huang et al.

(10) Patent No.: US 6,472,743 B2
(45) Date of Patent: Oct. 29, 2002

(54) SEMICONDUCTOR PACKAGE WITH HEAT DISSIPATING STRUCTURE

(75) Inventors: Chien-Ping Huang, Hsinchu Hsien; Chi-Chuan Wu, Taichung; Jui-Yu Chuang, Taichung; Lien-Chih Chan, Taichung; Ming-Chih Hsieh, Taipei, all of (TW)

(73) Assignee: Siliconware Precision Industries, Co., Ltd. (TW)

( * ) Notice: Subject to any disclaimer, the term of this patent is extended or adjusted under 35 U.S.C. 154(b) by 0 days.

(21) Appl. No.: 09/973,151

(22) Filed: Oct. 9, 2001

(65) Prior Publication Data

US 2002/0113308 A1 Aug. 22, 2002

(51) Int. Cl.⁷ .......................... H01L 23/34; H01L 23/28
(52) U.S. Cl. .................. 257/717; 257/705; 257/706; 257/707; 257/796
(58) Field of Search .................. 257/717, 704–707, 257/710, 713, 787, 796; 438/122, 125, 124, 126, 127

(56) References Cited

U.S. PATENT DOCUMENTS

| | | | | |
|---|---|---|---|---|
| 5,777,386 A | * | 7/1998 | Higashi et al. | 257/737 |
| 5,818,106 A | * | 10/1998 | Kinimatsu | 257/703 |
| 5,977,626 A | | 11/1999 | Wang et al. | 257/707 |
| 6,163,458 A | * | 12/2000 | Li | 361/704 |
| 6,255,143 B1 | * | 7/2001 | Briar | 438/127 |
| 6,285,554 B1 | * | 9/2001 | Westberg | 361/719 |
| 6,313,528 B1 | * | 11/2001 | Solberg | 257/723 |

* cited by examiner

Primary Examiner—Jasmine J B Clark
(74) Attorney, Agent, or Firm—Peter F. Corless; Steven M. Jensen; Edwards & Angell, LLP (57) ABSTRACT

A semiconductor package with a heat dissipating structure is proposed, in which the heat dissipating structure is precisely positioned on a substrate, in a manner that a plurality of solder balls self-align with ball pads formed on the substrate, and support a heat sink to be positioned above a semiconductor chip mounted on the substrate. This therefore makes the heat sink closely abut a molding cavity of an encapsulating mold in a molding process, and prevents resin flash from occurring on the heat sink, so that a surface of the heat sink can be directly exposed to the atmosphere for improving heat dissipating efficiency. Moreover, the solder balls characterized in softness deform in response to a pressure generated by the encapsulating mold during molding. Therefore, the substrate can be protected from being damaged by the pressure, and thus quality of the semiconductor package can be assured.

15 Claims, 5 Drawing Sheets

SEMICONDUCTOR PACKAGE WITH HEAT DISSIPATING STRUCTURE

FIELD OF THE INVENTION

The present invention relates to semiconductor packages, and more particularly, to a semiconductor package with a heat dissipating structure so as to improve heat dissipating efficiency thereof

BACKGROUND OF THE INVENTION

In the demand of high electricity and performance, a BGA (ball grid array) semi-conductor package correspondingly incorporates a greater quantity of I/O connections, and accommodates a plurality of array-arranged solder balls for electrically connecting a semiconductor chip to external devices, thereby making the semiconductor package become a mainstream product. However, in such a BGA semiconductor package, as the semiconductor chip is highly integrated due to the provision of the I/O connections in greater quantity, this accordingly results in more heat generated by operating such a semiconductor chip. Therefore, how to effectively dissipate the heat generated by the semiconductor chip is a main problem to be solved.

Figure 10:
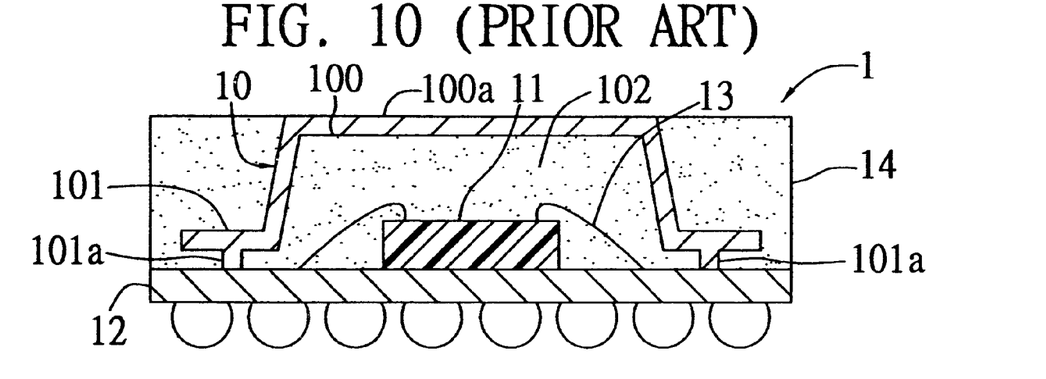
FIG. 10 (PRIOR ART) is a sectional view of a conventional semiconductor package.

U.S. Pat. No. 5,977,626 discloses a semiconductor package having a heat sink for improving heat dissipating efficiency. As shown in FIG. 10, in the disclosed semiconductor package 1, a heat sink 10 is disposed on a substrate 12, which is mounted with a chip 11 thereon. The heat sink 10 has a planar portion 100, and a supporting portion 101 used to support the planar portion 100 above the chip 11, wherein the planar portion 100 and the supporting portion 101 form a cavity 102 for receiving the chip 11 and gold wires 13 therein. The gold wires 13 are used to electrically connect the chip 11 to the substrate 12 in a manner as not to be in contact with the heat sink 10. Moreover, the supporting region 101a is formed with a plurality of protrusions 101a for attaching the heat sink 10 to the substrate 12 via the protrusions 101a.

Moreover, the heat sink 10 is made in a manner as to expose an upper surface 100a of the planar portion 100 to outside of an encapsulant 14 used for encapsulating the chip 11, thereby making the exposed upper surface 100a in direct contact with the atmosphere, so as to effectively improve the heat dissipating efficiency for the foregoing semiconductor package 1. Therefore, in a molding process for forming the encapsulant 14, the heat sink 10 needs to be dimensioned for allowing the upper surface 100a of the planar portion 100 to abut a top wall of a molding cavity of an encapsulating mold (not shown), and the upper surface 100a can be exposed to the atmosphere after the encapsulant 14 is completely formed. However, due to dimensional inaccuracy in the fabrication of the substrate 12 and the heat sink 10, if the heat sink 10 is made over-sized in height, the substrate 12 can be damaged by a stress from the heat sink 10 during the mold engagement. On the contrary, if the heat sink 10 is not sufficiently high, a gap is formed between the upper surface 100a of the heat sink 10 and the top wall of the molding cavity, thereby making a molding resin used for forming the encapsulant 14 flash over the upper surface 100a. This therefore detrimentally affects the heat dissipating efficiency of the heat sink 10 and appearance of the packaged product.

Moreover, the supporting portion 101 of the heat sink 10 is formed by stamping a planar metal piece, while this stamping process usually affects the planarity of the planar portion 100 of the heat sink 10, and thus resin flash can easily occur on the upper surface 100a of the planar portion 100. In a trend for fabricating low-profile semiconductor packages, a heat dissipating structure usually needs to be dimensioned to approximate 0.2 mm 0.2 mm or even thinner in thickness. Such a heat dissipating structure makes the planarity of its planar portion more easily affected during forming its supporting portion, and thus the resin flash problem is even more difficult to be eliminated.

Furthermore, the supporting portion 101 of the heat sink 10 is formed to extend outwardly and downwardly from a periphery of the planar portion 100, thereby allowing the protrusions 101a in contact with the substrate 12 to be located outside a projection area of the planar portion 100 on the substrate 12. As such, the substrate 12 needs to be dimensionally larger in surface area than the planar portion 100 so as to sufficiently accommodate the heat sink 10 thereon. This is then disadvantageous in dimensional miniaturization for the substrate 12, and also generates restriction on the size of the chip 11. Further, the protrusions 101a are attached to the substrate 12 by means of an adhesive, and thus are hardly to be precisely positioned. In the case of the protrusions 101a not accurately positioned on the substrate 12, the heat sink 10 can then be entirely dislocated. This thereby results in damage to the product appearance, or causes short circuit due to the supporting portion 101 coming into contact with the gold wires 13, which are used to electrically connect the chip 11 to the substrate 12.

In addition, in order to attach the heat sink 10 to the substrate 12 via the supporting portion 101, the substrate 12 needs to be sufficiently dimensioned for disposing the heat sink 10 on an area outside a wire-bonding area for accommodating the gold wires 13, without coming into contact with the gold wires 13 on the substrate 12. However, for a substrate having high density of gold wires disposed thereon for use with a highly integrated chip, there is often not possibly formed an sufficient area for mounting the supporting portion 101 outside the wire bonding area on the substrate. Similarly, a CSP (chip scale package) semiconductor package employs a substrate having an even smaller surface area, wherein the wire bonding area can only be formed between a die attaching area and a periphery of the substrate, thereby making the substrate not sufficient in area for accommodating the supporting portion 101. Thus, the heat sink 10 disclosed in the U.S. Pat. No. 5,977,626 is not suitably used with the substrate having high density of the gold wires or with the substrate used in the CSP semiconductor package.

SUMMARY OF THE INVENTION

A primary objective of the present invention to provide a semiconductor package with a heat dissipating structure, in which the heat dissipating structure can be precisely positioned, and a substrate can be prevented from being damaged in a molding process, as well as, resin flash can be avoided occurring on an exposed side of the heat dissipating structure. Moreover, the heat dissipating structure is mounted on the substrate in a manner as not to affect the disposition of bonding wires on the substrate. Furthermore, an area for depositing the heat dissipating structure on the substrate can be significantly reduced; this therefore makes the heat dissipating structure suitably used with a substrate having high density of bonding wires or with a substrate used in a CSP semiconductor package, and makes a chip used in the semiconductor package not limited in size.

In accordance with the foregoing and other objectives, the present invention proposes a semiconductor package device with a heat dissipating structure, comprising a substrate having an upper side and an opposing lower side; at least one semiconductor chip mounted on the upper side of the substrate and electrically connected to the substrate; a heat dissipating structure having a plurality of solder balls implanted on the upper side of the substrate, and a heat sink attached to the solder balls, wherein the heat sink has an upper side and an opposing lower side, and a plurality of connection pads are formed on the lower side at corresponding positions for bonding the solder balls thereto, so as to make the heat sink supported by the solder balls and positioned above the semiconductor chip; and an encapsulant for encapsulating the semiconductor chip and the heat dissipating structure on the upper side of the substrate, wherein the upper side of the heat sink is exposed to outside of the encapsulant.

The connection pads on the heat sink can be recesses formed on the lower side of the heat sink, or vias penetrating from the upper side to the lower side of the heat sink, wherein the vias allows a molding resin used for forming the encapsulant to flow there-through, so as to enhance the bonding affinity between the heat sink and the encapsulant.

A plurality of ball pads are formed on the substrate for implanting the solder balls thereon, and positioned between a periphery of the substrate and a periphery of the semiconductor chip in a manner not to interfere with a plurality of bonding wires used for electrically connecting the semiconductor chip to the substrate.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

First Preferred Embodiment

Figure 1:
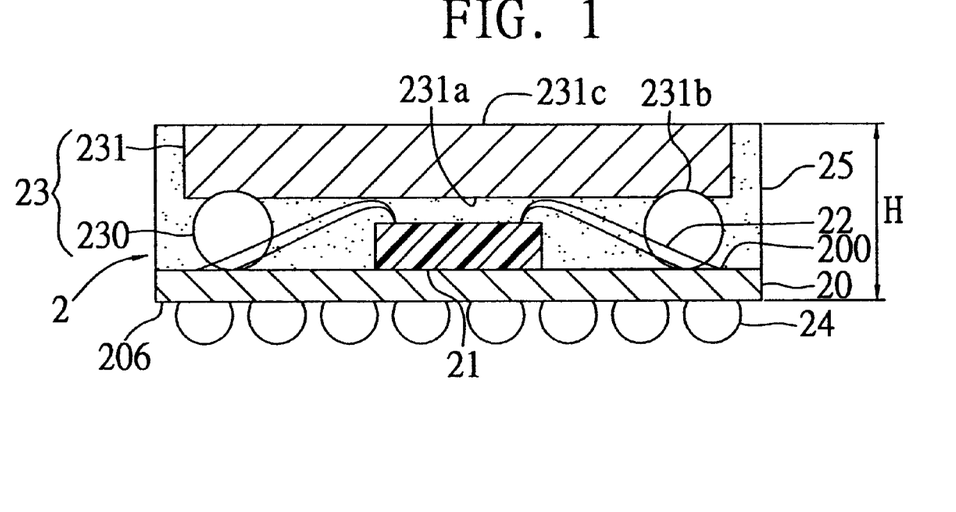
FIG. 1 is a sectional view of a first preferred embodiment of the semiconductor package of the invention.
Figure 2:
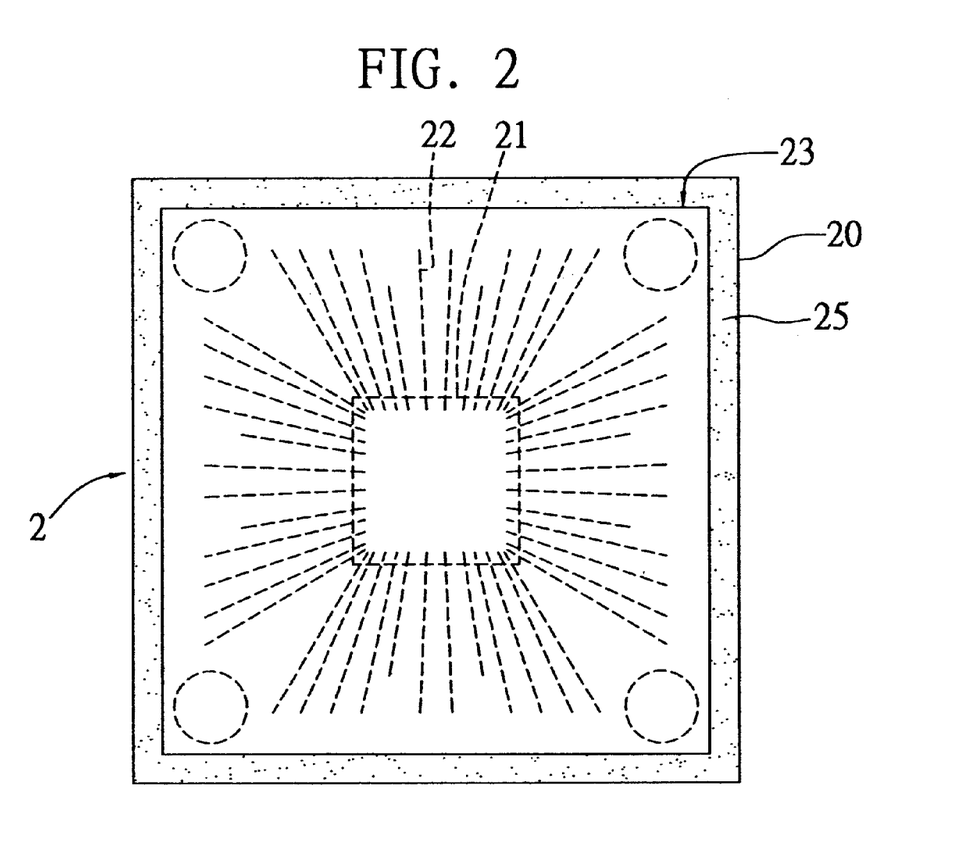
FIG. 2 is a front view of a first preferred embodiment of the semiconductor package of the invention.

Referring to FIGS. 1 and 2, a semiconductor package 2 of a first embodiment of the invention comprises a substrate 20, a semiconductor chip 21 mounted on the substrate 20, a plurality of gold wires 22 for electrically connecting the substrate 20 to the semiconductor chip 21, a heat dissipating structure 23 disposed on the substrate 20, and a plurality of solder balls 24 implanted on the substrate 20 for electrically connecting the semiconductor chip 21 to external devices, and an encapsulant 25 for encapsulating the semiconductor chip 21, the gold wires 22 and the heat dissipating structure 23.

Figure 3:
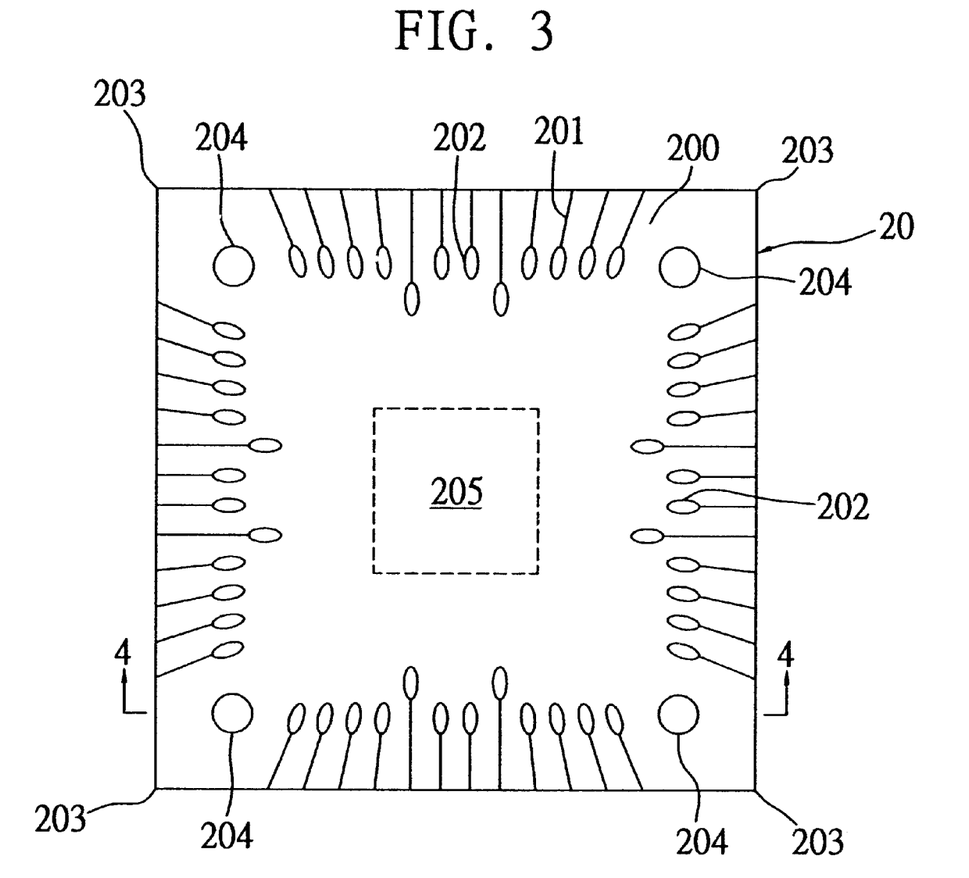
FIG. 3 is a font view of a substrate used in a first preferred embodiment of the semiconductor package of the invention.

Referring to FIG. 3, for use in a CSP semiconductor packages or a TFBGA (thin and fine ball grid array) semiconductor package, the substrate 20 has a front side 200 more densely formed with a plurality of conductive traces 201 thereon, and a plurality of bond fingers 202 for bonding the gold wires 22 are positioned near a periphery of the substrate 20. The substrate 20 having four corners 203 is formed with a plurality of ball pads 204 on the front side 200 near the corners 203. Alternatively, the substrate 20 can be formed with only three bond pads 204, which are sufficient to provide firm support to the heat dissipating structure 23 disposed on the substrate 20. Moreover, as the ball pads 204 also have a ground function, the overall heat dissipating efficiency and the electricity of the semiconductor package 2 can be improved, after connecting the heat dissipating structure 23 to the bond pads 204. Since the ball pads 204 are made the same as bonding pads used for implanting solder balls on a conventional BGA substrate, they are not further described herein. Furthermore, the solder balls 24 implanted on a back side 206 of the substrate 20 are arranged in array for electrically connecting the semiconductor chip 21 to the external devices; since the solder ball implantation is performed by employing a conventional technique, it is not further detailed herein.

Figure 4:
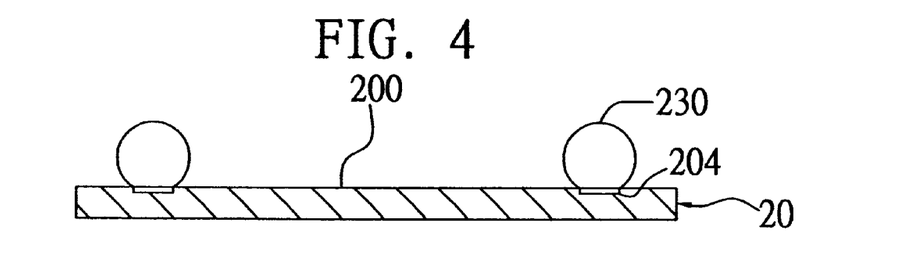
FIG. 4 is a sectional view of FIG. 3 cutting along the line 4—4, wherein each ball pad is implanted with a solder ball thereon.

Referring to FIG. 4, a conventional ball implanting machine is employed for respectively reflowing solder balls 230 to the corresponding ball pads 204 of the substrate 20. In this reflowing process, as the solder balls 230 are made of a material such as tin, lead, tin/lead alloy or similar metal, thus the solder balls 230 can self-align with the ball pads 204 to be precisely positioned on the substrate 20.

Referring further to FIGS. 1 and 2, the semiconductor chip 21 is attached to a die attaching area 205 formed on the front side 200 of the substrate 20 by means of an adhesive such as silver paste. Subsequently, the gold wires 22 respectively interconnect the semiconductor chip 21 and the bond fingers 202 of the substrate 20, so as to electrically connect the semiconductor chip 21 to the substrate 20.

Referring to FIG. 1, after completing the electrical connection between the semiconductor chip 21 and the substrate 20, a heat sink 231 is mounted on the solder balls 230 with a plurality of recesses 231b formed on a lower side 231a of the heat sink 231 at positions corresponding to the solder balls 230. A conductive adhesive or non-conductive adhesive is applied to the solder balls 230 for attaching the corresponding recesses 231b thereto after aligning the recesses 231b with the solder ball 230, and the heat sink 231 together with the attached solder balls 230 form the heat dissipating structure 23. Since the solder balls 230 are accurately implanted on the substrate 20 and the solder balls 230 are precisely attached to the recesses 231b, therefore the heat sink 231 can also be precisely positioned on the substrate 20. The heat sink 231 supported by the solder balls 230 can then be positioned above the semiconductor chip 21 and the gold wires 22 without coming into contact with the gold wires 22. Moreover, the solder balls 230 precisely controlled in height also ensures the accuracy of height H of the heat dissipating structure 23, so that a problem of the heat sink 231 coming into contact with the gold wires 22 or even the semiconductor chip 21 due to insufficient height H of the heat dissipating structure 23 can be eliminated, and thus quality of fabricated products can be assured. As the solder balls 230 are made of a conventional material characterized in softness such as tin, lead, tin/lead alloy or similar metal/alloy, the height H of the heat dissipating structure 23 can be made slightly greater than that between the top wall of the molding cavity of the encapsulating mode (not shown) and the front side 200 of the substrate 20. In the molding process, the top wall of the molding cavity slightly presses downwardly on the heat sink 231, which abuts the top wall of the molding cavity. As a result, the solder balls 230 attached to the heat sink 231 deform in response to the pressure from the encapsulating mold, thereby making an upper side 231c of the heat sink 231 come into close contact with the top wall of the molding cavity without forming any gap therebetween. This therefore prevents resin flash from occurring on the upper side 231c of the heat sink 231, and appearance and the heat dissipating efficiency can be assured for fabricated products. Further, as the solder balls 230 deform for releasing the pressure from the encapsulating mold through the heat sink on the substrate 20, thus the substrate 20 can be protected from being damaged by the pressure in the molding process.

Besides, since the ball pads 204 are positioned near the corners 203 on the substrate 20, the attachment of the heat dissipating structure 23 to the substrate 20 does not interfere with the arrangement of the gold wires disposed on the substrate 20; that is, the ball pads 204 and the bonded solder balls 230 can be positioned between any two adjacent gold wires. This eliminates the restriction in the above-mentioned semiconductor package 1 on the heat sink 10 to be necessarily mounted outside the wire bonding area on the substrate 12. Further, the ball pads 204 form near the corners 203 are located in proximity to the periphery of the substrate 20, so that area on the substrate 20 occupied by the ball pads 204 is reduced to the minimum, thereby making the substrate 20 applicable to the CSP or TFBGA semiconductor package without any practical limitations. Moreover, as the heat sink 231 is characterized in forming the recesses 231b on the lower side 231a for bonding the solder balls 230, it therefore can be fabricated in a simpler and more cost-effective manner as compared with the heat sink 10 used in the conventional semiconductor package 1, wherein the heat sink 10 is made by using the stamping technique to form the supporting portion 101 and the protrusions 101a, thereby increasing the cost and complexity in fabrication. The supporting portion 101 and the protrusions 101a are further disadvantageous to be not precisely controllable in height, and thus damage to the substrate 12 or resin flash on the heat sink 10 can easily occur. On the contrary, the heat dissipating structure 23 of the invention is free of the foregoing drawbacks, and is formed with the heat sink 231 good in planarity, so that resin flash can be effectively prevented from occurrence.

In addition, further referring to the conventional semiconductor package 1 shown in FIG. 10, the heat sink 10 is attached to the substrate 12 only via the protrusions 101a, thereby making it difficult to accurately position the heat sink 10 on the substrate 12. When the heat sink 10 or the other protrusions 101a are dislocated, the supporting portion 101 of the heat sink 10 easily comes into contact with the gold wires 13, resulting in short circuit and quality deterioration for fabricated products. On the other hand, the solder balls 230 of the heat dissipating structure 23 of the invention are reflowed to the ball pads 204, and the solder balls 230 can self-align to be precisely positioned at the balls pads 204 on the substrate 20. This also makes the heat sink 231 precisely attached to the solder balls 230 via the recesses 231b without being dislocated.

The encapsulant 25 made of a conventional epoxy resin is used for encapsulating the semiconductor chip 21, the gold wires 22 and the heat dissipating structure 23. As described above, in order to significantly improve the heat dissipating efficiency, the upper side 231c of the heat sink 231 in the heat dissipating structure 23 is exposed to outside of the encapsulant 25 and in direct contact with the atmosphere. In the heat dissipating structure 23 of the invention, the solder balls 230 support the heat sink 231 to be positioned above the semiconductor chip 21, and can deform in response to pressure. Therefore, the height H of the heat dissipating structure 23 can be made slightly greater than the distance between the front side 200 of the substrate 20 and the top wall of the molding cavity of the encapsulating mold, so as to make the upper side 231c of the heat sink 231 closely abut the top wall of the molding cavity without forming any gap therebetween in the molding process. As a result, after completing the molding process, no resin flash occurs on the upper side 231c of the heat sink 231.

Second Preferred Embodiment

Figure 5:
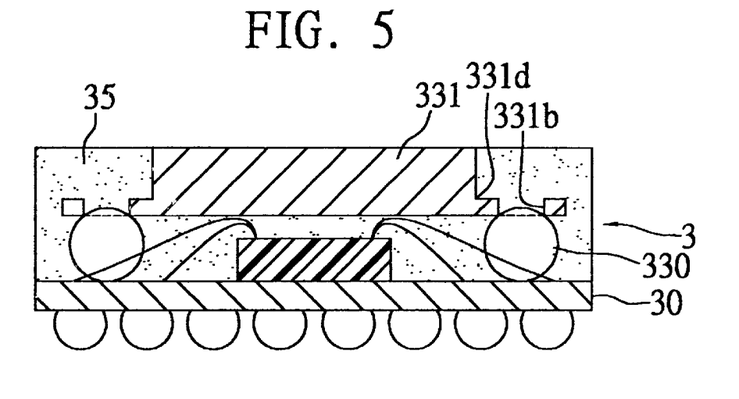
FIG. 5 is a sectional view of a second preferred embodiment of the semiconductor package of the invention.

Illustrated in FIG. 5 is a sectional view of a second preferred embodiment of the semiconductor package of the invention.

The semiconductor package 3 of the second embodiment is substantially identical to that disclosed in the first embodiment, with the only difference in that, in the semiconductor package 3, a plurality of penetrating vias 331b are formed to penetrate a heat sink 331 at positions for bonding solder balls 330 disposed on a substrate 30, in place of the recesses 231b used in the first embodiment. Moreover, the vias 331b allow a molding resin used for forming an encapsulant 35 to flow therethrough, thereby increasing the bonding affinity between the encapsulant 35 and the heat sink 331 and preventing the occurrence of delamination. Furthermore, the heat sink 331 is thinned at each via-forming position for forming a shoulder portion 331d, which is also encapsulated by the molding resin, and therefore further enhances the bonding affinity between the heat sink 331 and the encapsulant 35.

Third Preferred Embodiment

Figure 6:
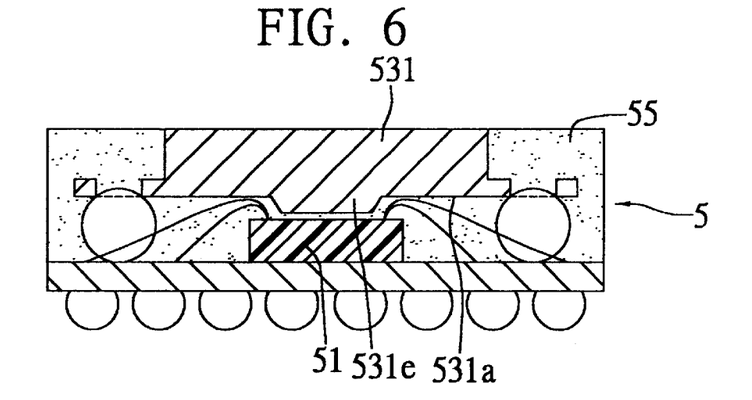
FIG. 6 is a sectional view of a third preferred embodiment of the semiconductor package of the invention.

Illustrated in FIG. 6 is a sectional view of a third preferred embodiment of the semiconductor package of the invention.

The semiconductor package 5 of the third embodiment is substantially identical to that disclosed in the second embodiment, with the only difference in that, in the semiconductor package 5, on a lower side 531a of a heat sink 531 there is formed a protrusion 531e extending downwardly for reducing a gap between the heat sink 531 and a semiconductor chip 51, thereby making a heat-dissipating path shortened from the semiconductor chip 51 through an encapuslant 55 poor in thermal conductivity to the heat ductor chip 51 through an encapuslant 55 poor in thermal conductivity to the heat sink 531 for facilitating dissipation of heat generated by the semiconductor chip 51, and thus heat dissipating efficiency of the semiconductor package 5 can be further improved. In order to avoid void formation due to the gap reduction between the heat sink 531 and the semiconductor chip 51, a plurality of grooves (not shown) are formed on a surface of the protrusion 531e facing the semiconductor chip 51, so as to improve the flow rate of a molding resin used for forming the encapsulant 55 flowing between the protrusion 531e and the semiconductor chip 51 in a molding process.

Fourth Preferred Embodiment

Figure 7:
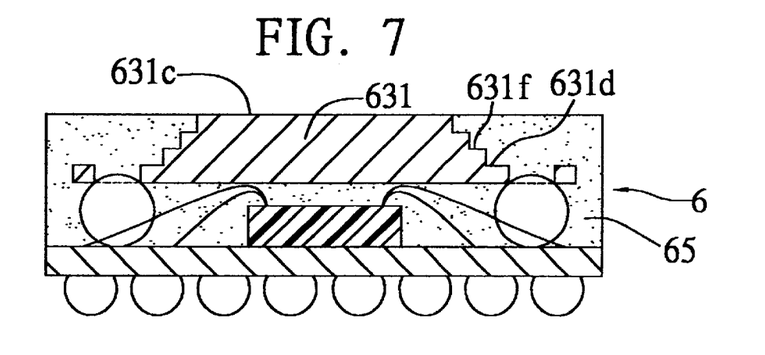
FIG. 7 is a sectional view of a fourth preferred embodiment of the semiconductor package of the invention.

Illustrated in FIG. 7 is a sectional view of a fourth preferred embodiment of the semiconductor package of the invention.

The semiconductor package 6 of the fourth embodiment is substantially identical to that disclosed in the second embodiment, with the only difference in that, in the semiconductor package 6, on an upper side 631c of a heat sink 631 there is formed a ladder-like concave portion 631f connected adjacent to a shoulder portion 631d. With the formation of the ladder-like concave portion 631f, the flow rate of a molding resin flowing to the ladder-like concave portion 631f is reduced in a molding process, and thus resin flash can be effectively prevented from occurring on the upper side 631c of the heat sink 631. As a result, in the provision of the ladder-like concave portion 631f, the heat sink 631 can have its upper side 631c, which is exposed to outside of an encapsulant 65 made of the molding resin, to be further assured with no occurrence of the resin flash.

Fifth Preferred Embodiment

Figure 8:
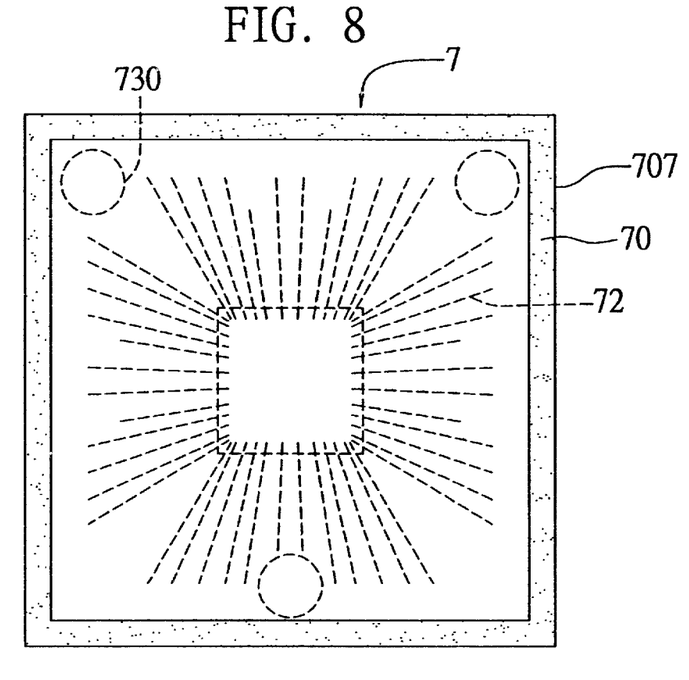
FIG. 8 is a front view of a fifth preferred embodiment of the semiconductor package of the invention.

Illustrated in FIG. 8 is a front view of a fifth preferred embodiment of the semiconductor package of the invention.

The semiconductor package 7 of the fifth embodiment is substantially identical to that disclosed in the first embodiment, with the only difference in that, in the semiconductor package 7, a plurality of solder balls 730 are implanted in proximity to a periphery 707 of a substrate 70, but not close to corners of the substrate 70. As shown in the drawing, the solder balls 730 are positioned between the periphery 707 and a wire bonding area for disposing a plurality of gold wires 72 on the substrate 70, in a manner as not to interfere or come into contact with the gold wires 72.

Sixth Preferred Embodiment

Figure 9:
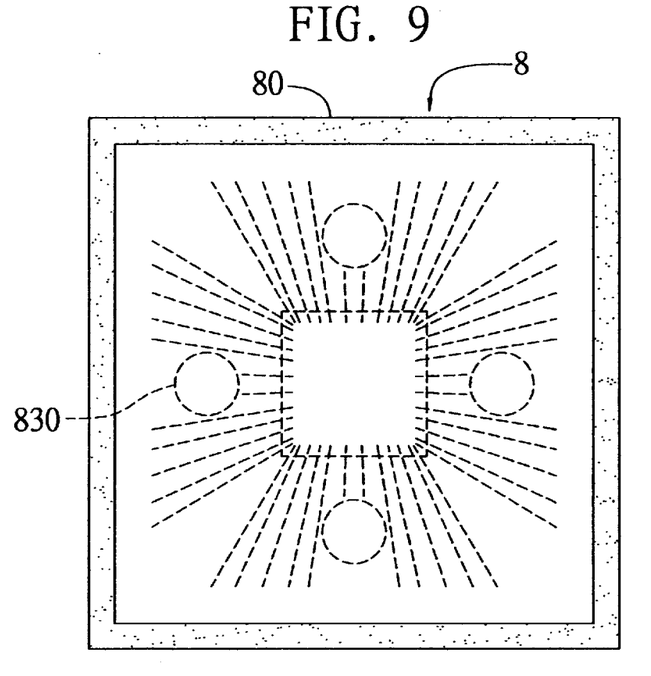
FIG. 9 is a front view of a sixth preferred embodiment of the semiconductor package of the invention.

Illustrated in FIG. 9 is a front view of a sixth preferred embodiment of the semiconductor package of the invention.

The semiconductor package 8 of the sixth embodiment is substantially identical to that disclosed in the first embodiment, with the only difference in that, in the semiconductor package 8, a plurality of solder balls 830 are implanted on a substrate 80 at positions between any two wire bonding areas (not designated by reference numerals in the drawing). This indicates that the solder balls, acting as supporting elements for the planar heat sink in the heat dissipating structure of the invention, can be disposed at any positions on the substrate outside a die attaching area and not interfering with the gold wires, thereby making the bonding of the heat dissipating structure to the substrate well flexible in arrangement.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements

What is claimed is:

1. A semiconductor package with a heat dissipating structure, comprising:

a substrate having an upper side and an opposing lower side;

at least one semiconductor chip mounted on the upper side of the substrate and electrically connected to the substrate;

a heat dissipating structure having a plurality of solder balls implanted on the upper side of the substrate, and a heat sink attached to the solder balls, wherein the heat sink has an upper side and an opposing lower side, and a plurality of connection pads are formed on the lower side at corresponding positions for bonding the solder balls thereto, so as to make the heat sink supported by the solder balls and positioned above the semiconductor chip; and an encapsulant for encapsulating the semiconductor chip and the heat dissipating structure on the upper side of the substrate, wherein the upper side of the heat sink is exposed to outside of the encapsulant.

2. The semiconductor package of claim 1, wherein the solder balls are each made of a material selected from the group consisting of tin, lead, tin/lead alloy and similar alloy.

3. The semiconductor package of claim 1, wherein the connection pads each is a recess formed on the lower side of the heat sink.

4. The semiconductor package of claim 1, wherein the connection pads each is a via penetrating the heat sink.

5. The semiconductor package of claim 1, wherein a ladder-like concave portion is formed at a periphery of the heat sink.

6. The semiconductor package of claim 1, wherein a protrusion is formed downwardly on the lower side of the heat sink for reducing a gap between the heat sink and the semiconductor chip.

7. The semiconductor package of claim 1, wherein a plurality ball pads are disposed on the upper side of the substrate for implanting the solder balls thereon.

8. The semiconductor package of claim 1, wherein the semiconductor chip is electrically connected to the substrate by a plurality of bonding wires.

9. The semiconductor package of claim 1, wherein the solder balls are disposed on the upper sided of the substrate at positions in proximity to corners of the substrate.

10. The semiconductor package of claim 1, wherein the solder balls are disposed on the upper side of the substrate at positions in proximity to a periphery of the substrate.

11. The semiconductor package of claim 1, wherein the solder balls are disposed on the upper side of the substrate at positions between a periphery of the semiconductor chip and a periphery of the substrate.

12. The semiconductor package of claim 4, wherein the heat sink is formed with a shoulder portion for constructing the via thereon.

13. The semiconductor package of claim 7, wherein the solder balls are implanted on the ball pads on the substrate by using a reflow process.

14. The semiconductor package of claim 8, wherein the bonding wires are gold wires.

15. The semiconductor package of claim 7, wherein the ball pads are ground pads.

* * * * *

UNITED STATES PATENT AND TRADEMARK OFFICE
CERTIFICATE OF CORRECTION

PATENT NO. : 6,472,743 B2
DATED : October 29, 2002
INVENTOR(S) : Huang et al.

It is certified that error appears in the above-identified patent and that said Letters Patent is hereby corrected as shown below:

<u>Title page,</u>
After Item [65], please add:

-- [30] Foreign Application Priority Data

Feb. 22, 2001 (TW) ……………….. 90104008 --.

Signed and Sealed this

Twenty-sixth Day of August, 2003

JAMES E. ROGAN
*Director of the United States Patent and Trademark Office*